United States Patent
Dams

(10) Patent No.: US 7,259,832 B2
(45) Date of Patent: Aug. 21, 2007

(54) LITHOGRAPHIC APPARATUS AND DEVICE MANUFACTURING METHOD

(75) Inventor: Johannes Adrianus Antonius Theodorus Dams, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 84 days.

(21) Appl. No.: 10/948,787

(22) Filed: Sep. 24, 2004

(65) Prior Publication Data

US 2005/0094118 A1    May 5, 2005

(30) Foreign Application Priority Data

Sep. 26, 2003 (EP) ................... 03078049

(51) Int. Cl.
G03B 27/58 (2006.01)
G03B 27/42 (2006.01)

(52) U.S. Cl. ......................... 355/72; 355/53
(58) Field of Classification Search ................. 355/53, 355/72, 75; 310/10, 12
See application file for complete search history.

(56) References Cited

U.S. PATENT DOCUMENTS

| | | | |
|---|---|---|---|
| 3,772,540 A * | 11/1973 | Benson ................ 310/14 |
| 4,507,597 A * | 3/1985 | Trost ................... 318/653 |
| 4,724,412 A * | 2/1988 | Kalafala ............... 335/299 |
| 4,751,487 A | 6/1988 | Green, Jr. |
| 4,858,452 A | 8/1989 | Ibrahim |
| 5,012,144 A | 4/1991 | Huitema et al. |
| 5,024,247 A | 6/1991 | Lembke |
| 5,079,534 A | 1/1992 | Steingroever et al. |
| 5,309,050 A | 5/1994 | Morinigo et al. |
| 5,844,666 A * | 12/1998 | Van Engelen et al. ....... 355/72 |
| 6,437,864 B1 * | 8/2002 | Watanabe et al. .......... 356/399 |
| 2002/0140298 A1 * | 10/2002 | Maruyama ................. 310/54 |
| 2003/0016107 A1 | 1/2003 | Hazelton |
| 2004/0070285 A1 * | 4/2004 | Sogard ..................... 310/12 |

* cited by examiner

Primary Examiner—W. B. Perkey
Assistant Examiner—Kevin Gutierrez
(74) Attorney, Agent, or Firm—Pillsbury Winthrop Shaw Pittman LLP

(57) ABSTRACT

A method and a system for accurate positioning of an object are presented. An embodiment of the invention includes an electromagnetic actuator including a coil assembly. The coil assembly includes two coils that encloses a magnet assembly including a magnet that is magnetized in the direction of the generated force. The generated force is substantially constant over the operating range of the actuator. The actuator may further be equipped with a cooling body surrounding the coil assembly.

21 Claims, 7 Drawing Sheets

Prior art

LITHOGRAPHIC APPARATUS AND DEVICE MANUFACTURING METHOD

PRIORITY INFORMATION

This application claims priority from European Patent Application No. 03078049.8, filed Sep. 26, 2003, the content of which is herein incorporated by reference in its entirety

BACKGROUND

1. Field of the Invention

The present invention relates to lithographic apparatus and methods.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In such a lithographic apparatus, accurate positioning of an object or an object table is desirable. This object can, as an example, be an object table or an optical element such as a lens or a mirror. Such positioning can be realized by using an electromagnetic actuator. In general, an electromagnetic actuator includes two assemblies, a first assembly (also referred to as the magnet assembly) including at least one or more permanent magnets and a second assembly (also referred to as the coil assembly) including at least one or more coils. One of the properties of some electromagnetic actuators is that the force generated between both assemblies of the actuator is substantially independent of the relative position of both parts in the operating range of the actuator. This allows for a good dynamic response of the actuator since the relationship between current in the coil and generated force is known, regardless of the relative position of both parts. As a consequence, vibrations of one part are not transmitted to the other part as vibrations of one part do not cause a force variation on the other part. Assuming the coil assembly is mounted on a machine frame and the magnet assembly is connected to the object that requires accurate positioning or displacement, vibrations of the machine frame will not be transmitted to the object in case the force generated between both parts is substantially independent of the relative position of both parts. A number of state of the art actuators such as voice coil motors or linear actuators do, to some extent, have this property of providing a force that is substantially independent of the relative position of both actuator parts.

To avoid thermal disturbances of the object, it is the magnet assembly of the actuator may be attached to the object and not the coil assembly. Another reason for attaching the magnet assembly to the object and not the coil assembly is that the wiring of the coil assembly (from the coils to the amplifier) may cause disturbances during displacement of the coil assembly when it is attached to the object. Further the movement of wires and possibly water cooling tubes could potentially cause life cycle problems, since they are dynamically stressed during the life of the actuator.

The aforementioned actuators such as voice coil actuators or conventional linear actuators may, in some instances, employ a magnet having a weight that is significant and that may have some impact on dynamic response.

With such conventional actuators, a large part of the actuator coils is enclosed by the magnet assembly. Therefore, an effective cooling of the coils may be difficult.

SUMMARY

Embodiments of the invention include an electromagnetic actuator, a lithographic apparatus and a device manufacturing method. In an embodiment of the invention, a lithographic apparatus includes an illumination system configured to provide a beam of radiation; a support structure configured to support a patterning device, the patterning device serving to impart the beam of radiation with a pattern in its cross-section; a substrate table configured to hold a substrate; a projection system configured to project the patterned beam onto a target portion of the substrate, and an actuator configured to position a first part of the lithographic apparatus relative to a second part of the lithographic apparatus in a first direction, the actuator including a first assembly attached to the first part and a second assembly attached to the second part. The first assembly includes at least one permanent magnet that is magnetized substantially in the first direction and the second assembly includes at least two coils having their conductive parts substantially perpendicular to the first direction, the at least two coils defining a space between them in the first direction whereby the at least one magnet of the magnet assembly is at least partly located in the space.

It will be appreciated that the actuator, in accordance with an embodiment of the invention, can be configured to move any parts of an apparatus. For example, in an embodiment of the invention, the actuator may be configured to move an object table, e.g. a substrate table or a patterning device support, or an optical element such as a lens or a mirror. In this context, the first and second part of the coil assembly can be any parts of the apparatus. In an embodiment of the invention, the first part can be a base part or a long stroke module and the second part can be a short stroke module, the substrate table, the patterning device, an isolated reference frame, a metrology frame, or an optical element (e.g., mirror or lens).

An electromagnetic actuator described in accordance with an embodiment of the present invention has a first assembly (or magnet assembly) that is small in volume and weight compared to the second assembly (i.e. the assembly equipped with the coils). This is favorable in view of the fact that the magnet assembly may be attached to the object to be positioned or displaced. Both for reasons of efficiency and dynamic response, it may be beneficial to have the weight of the moving part of the actuator (i.e. the part attached to the object that is to be positioned) to be small, since this weight also has to be displaced.

Furthermore, the actuator layout as described in an embodiment of the present invention results in a substantially constant force between both actuator parts for a given current in the coils, both for displacement in the direction of the generated force, displacements in a direction perpendicular to the direction of the generated force and for rotations.

According to an embodiment of the present invention, the current carrying coils of the coil assembly are more easily accessible than the conventional coil assemblies. This allows for a more effective cooling of the coils.

In a further embodiment of the invention, the coil assembly is equipped with two additional coils in order to increase the range wherein the generated force remains substantially constant.

In a further embodiment of the invention, the inner diameter of the coils is varied over the height of the coil in order to improve the range wherein the generated force remains substantially constant.

In a further embodiment of the invention, the coil assembly further includes a magnet system causing a bias force to be generated between the magnet assembly and the magnet system attached to the coil assembly.

In case the actuator is used for positioning the object in vertical direction, this further embodiment of the invention can result in an improved efficiency of the actuator since the generated bias force can be applied to compensate a substantial part of the weight of the object.

In an embodiment of the invention, the magnet assembly includes two magnets, the distance between both magnets being adjustable. By changing the distance between both magnets, the generated bias force may be altered. Therefore, this arrangement allows for a more flexible use of the actuator i.e. for positioning of objects of different weight.

The device manufacturing method according to an embodiment of the present invention includes patterning a beam of radiation with a pattern in its cross-section; projecting the patterned beam of radiation onto a target portion of a substrate, and positioning a first part of a machine relative to a second part of the machine by an actuator that includes a first assembly attached to the first part, and a second assembly attached to the second part. The first assembly includes at least one permanent magnet that is magnetized in substantially the first direction and the second assembly includes at least two coils having their conductive parts substantially perpendicular to the first direction, the at least two coils defining a space between them in the said direction whereby the at least one magnet of the magnet assembly is at least partly located in the space.

An embodiment of the invention includes a cooling method proposed that provides an efficient way of removing the dissipation in the current carrying coils. The proposed method is particularly suited for cooling cylindrical coils but can also be applied otherwise. The cooling by this method is performed by enclosing the coil by a cooling body that is provided with water ducts. Such cooling body can be provided on the inside diameter and/or on the outside diameter.

In an embodiment of the invention, there is provided an actuator configured to position a first part of a lithographic apparatus relative to a second part of the apparatus in a first direction. The actuator includes a first assembly attached to the first part, the first assembly including a permanent magnet having a direction of magnetization substantially parallel to the first direction, and a second assembly attached to the second part, the second assembly including at least two coils having conductive parts substantially perpendicular to the first direction, wherein the at least two coils are spaced apart in substantially the first direction so as to define a space between them in which the permanent magnet of the first assembly is at least partly located.

In an embodiment of the invention, the at least two coils and the permanent magnet are at least substantially rotationally symmetric around a common axis substantially parallel to the first direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool). Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
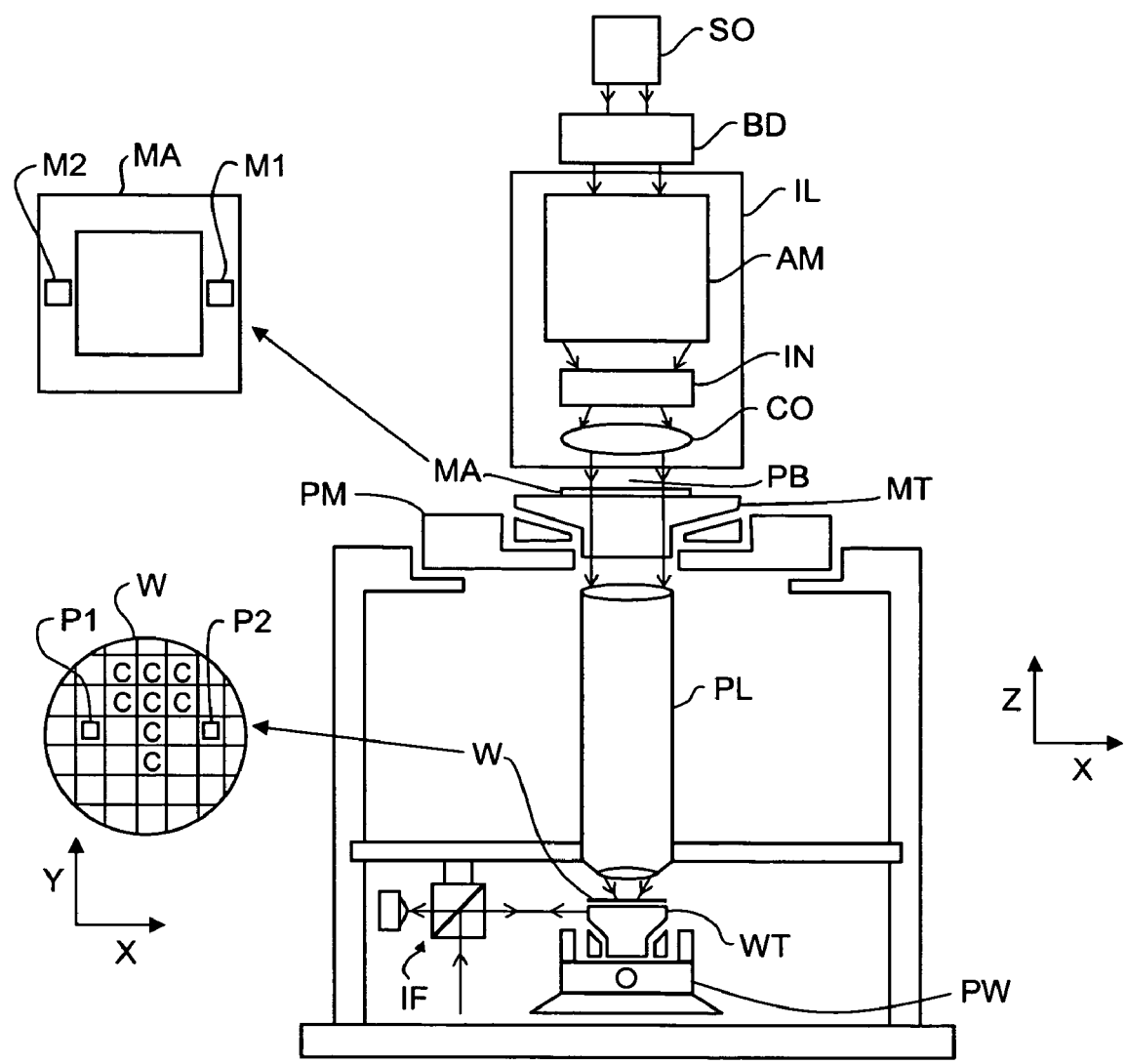
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation or EUV radiation) and a first support structure (e.g. a mask table) MT configured to support a patterning device (e.g. a mask) MA and connected to first a positioning device PM configured to accurately position the patterning device with respect to item PL ("lens"). The apparatus also includes a substrate table (e.g. a wafer table) WT configured to hold a substrate (e.g. a resist-coated wafer) W and connected to a second positioning device PW configured to accurately position the substrate with respect to item PL ("lens"), and a projection system (e.g. a refractive projection lens) PL configured to image a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The projection beam PB is incident on the mask MA, which is held on the mask table MT. Having traversed the mask MA, the beam of radiation PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

Step mode: the mask table MT and the substrate table WT are kept essentially stationary, while an entire pattern imparted to the beam of radiation is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
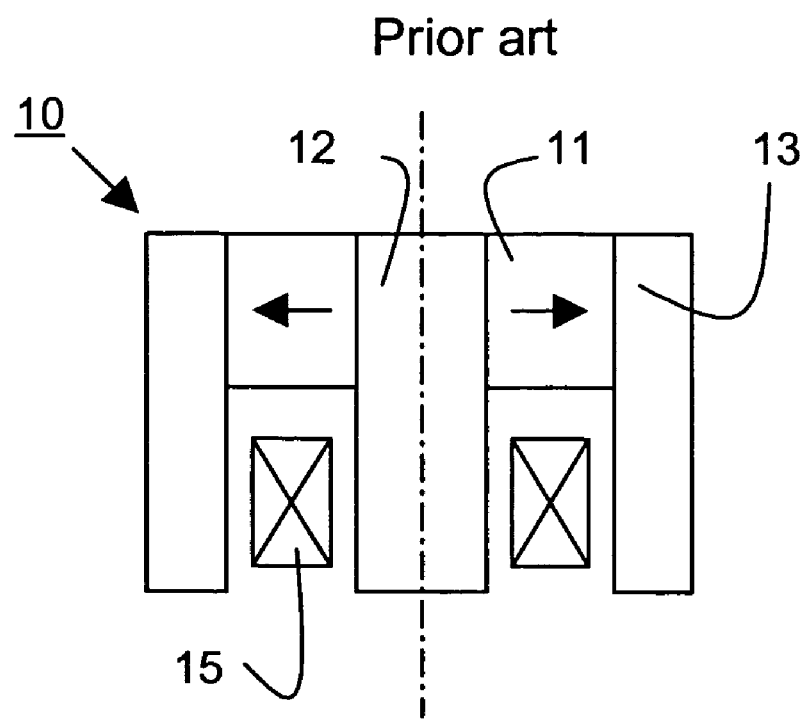
FIG. 2 schematically depicts a conventional electromagnetic actuator.
Figure 3:
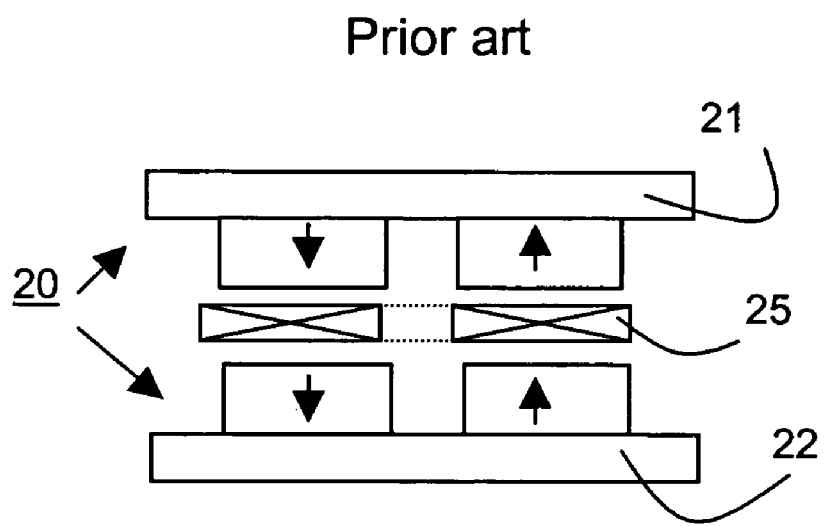
FIG. 3 schematically depicts another conventional electromagnetic actuator.

FIG. 2 depicts a so-called voice-coil actuator as known in the art. The actuator includes a first assembly 10 and a second assembly comprising a coil 15. The first assembly includes a magnet 11 and different ferromagnetic components 12,13. The ferromagnetic components result in a heavy and voluminous first assembly compared to the second assembly. Another example of a conventional electromagnetic actuator is shown in FIG. 3. The first assembly 20 of the actuator shown in FIG. 3 includes two magnet plates each including a ferromagnetic plate 21,22 equipped with a number of permanent magnets. The actuator further includes a second assembly including a coil 25 that is enclosed by both magnet plates. As can be seen from both FIGS. 2 and 3, the coils of the second assemblies are only accessible along a small part of the cross-section of the coil. This may compromise an efficient cooling of the coils and may result in more unwanted heat to be transferred from the coil assembly to other components of the system.

Figure 4A:
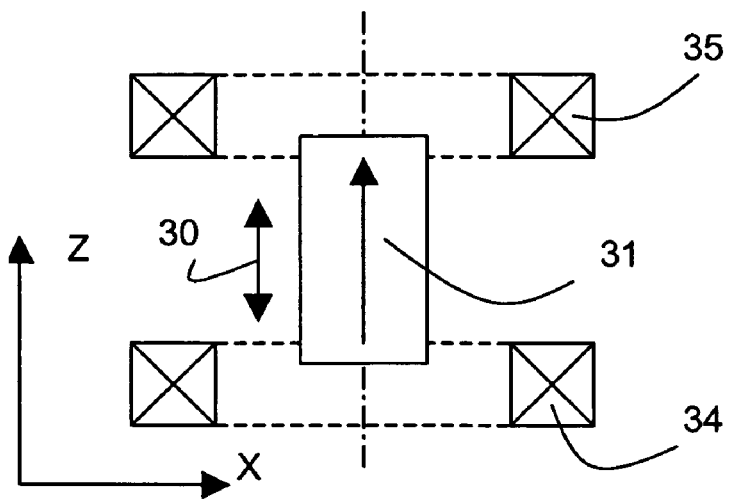
FIG. 4a schematically depicts an electromagnetic actuator according to an embodiment of the present invention.
Figure 4B:
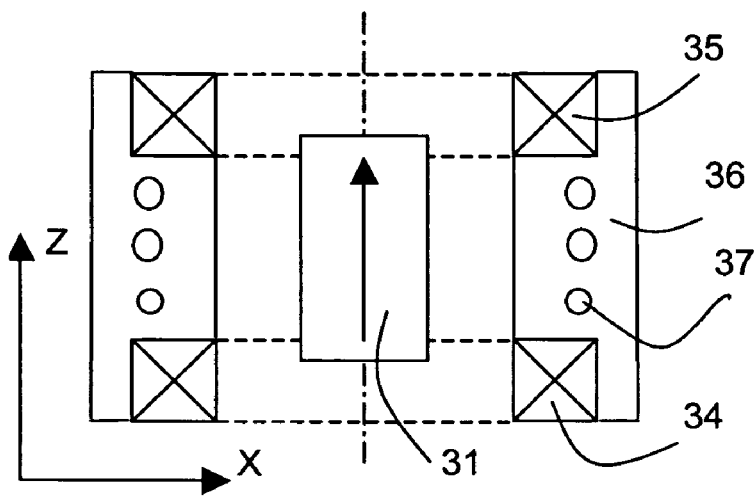
FIG. 4b schematically depicts an electromagnetic actuator according to an embodiment of the present invention including a cooling body.
Figure 4C:
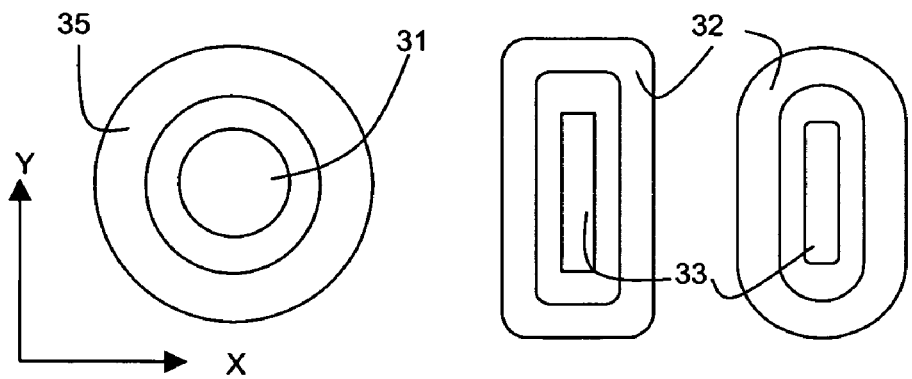
FIG. 4c schematically depicts a cross-section of an arrangement of coils and magnets according to an embodiment of the present invention.

FIG. 4a shows an electromagnetic actuator according to an embodiment of the present invention. The actuator includes a first assembly (also referred to as the magnet assembly) including a magnet 31 that is magnetized in Z-direction and a second assembly (also referred to as the coil assembly) that includes two coils 34,35. In this embodiment, the coils 34, 35 are shown as two cylindrical shaped coils that are positioned along a common axis in the Z-direction and having their conductors substantially perpendicular to the Z-direction. The coils may be wound of conventional copper wire or may be foil coils including, for example, Cu or Al as conductor. The magnet assembly is positioned between both coils. The magnet 31 is shown as a solid cylindrical shaped magnet but may also be a hollow cylindrical magnet. When coils 34 and 35 are energized with a current I and −I respectively, a force is generated between the coil assembly and the magnet assembly in a first direction, indicated by the arrow 30, the first direction being parallel to the Z-direction. The force is proportional to the current I and is found to remain substantially constant for small displacements (~a few mm) in Z-direction, small displacements in a direction perpendicular to the Z-direction and small rotations. Due to the fact that the generated force between both parts of the actuator is substantially constant in the operating range, vibrations of one part of the actuator are not transmitted to the other part, as vibrations of one part do not cause a force change on the other part. As can be seen from FIG. 4a, both coils of the coil assembly are easily accessible thereby allowing an effective cooling of the coils. Efficient cooling of the coils can be performed by mounting the coils on a cooling body 36 as shown in FIG. 4b. The cooling body can, as an example, be made of ceramic or any non-magnetic alloy or metal. The cooling body is equipped with a number of cooling ducts 37 through which a fluid can flow. In this way, the dissipation in the coils can efficiently be removed. The coils may also have a substantially square or rectangular shape or a more conventional shape with two parallel straight parts and end turns. In that case, the shape of the magnet 31 can be different from a cylindrical shape. FIG. 4c schematically shows an XY-view of the actuator shown in FIG. 4a together with some equivalents applying coils 32 and magnets 33 having a non-cylindrical shape. It will be clear that also for these coil shapes, cooling bodies can be designed similar to the embodiment of FIG. 4b.

Figure 5:
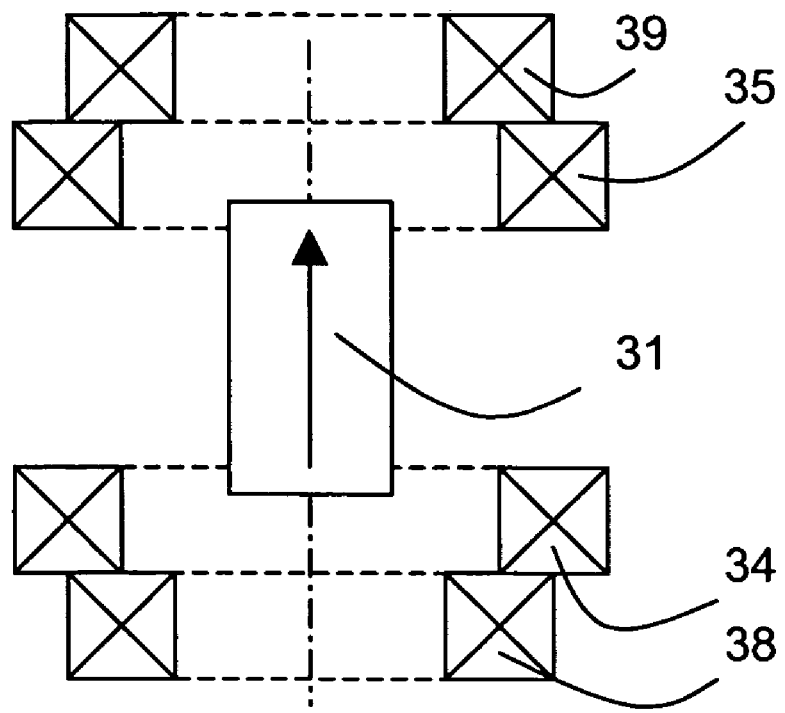
FIG. 5 schematically depicts an electromagnetic actuator according to an embodiment of the present invention.

FIG. 5 shows a further embodiment of the invention wherein two coils 38,39 have been added to the coil assembly. The coils 38 and 39 may be equipped with the aforementioned current I resp. −I although a different current may also be applied compared to the coils 34 and 35. Also the number of turns in coils 38 and 39 can be different from the number of turns of coils 34 and 35. The coils 38 and 39 may also have a different cross-section than the coils 34 and 35. By adding the two coils 38 and 39, the operating area wherein the generated force remains substantially constant for displacements in X, Y or Z-direction is increased. Applying the additional coils results in an improved dynamic performance of the actuator. The additional coils are located at a larger distance (in Z-direction) from the magnet assembly and have a smaller inner diameter.

Figure 6:
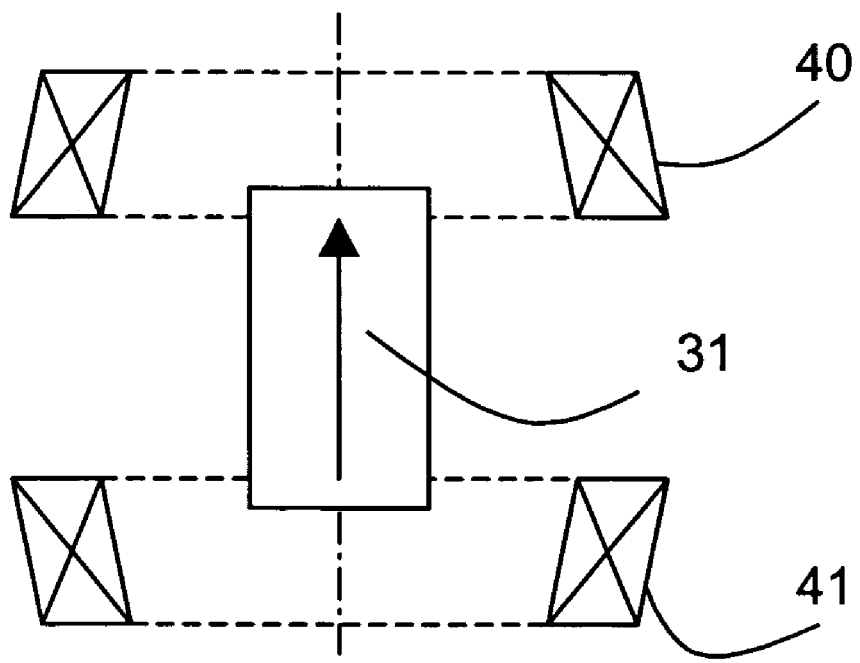
FIG. 6 schematically depicts an electromagnetic actuator according to another embodiment of the present invention.

FIG. 6 shows another embodiment of the invention wherein the coils 40, 41 of the coil assembly have an inner diameter that varies with the height of the coils. This provides a larger operating area wherein the actuator force remains substantially constant compared to the embodiment shown in FIG. 4.

Figure 7:
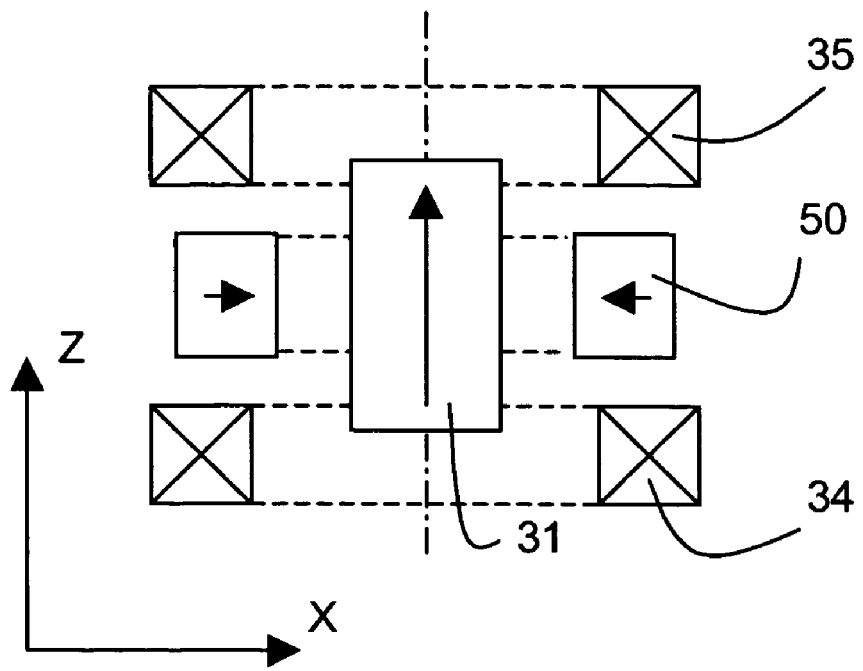
FIG. 7 schematically depicts an electromagnetic actuator according to an embodiment of the present invention.

FIG. 7 shows an embodiment of the present invention wherein a magnet 50 is added to the coil assembly. In the embodiment of FIG. 7, the magnet 50 is a cylindrical magnet magnetized in radial direction. The magnet can include a single magnetized ring or may include different segments. The effect of including the magnet 50 to the coil assembly is that a bias force is generated between the coil assembly (including the coils 34,35 and the magnet 50) and the magnet assembly including the magnet 31, the bias force being directed in the Z-direction. Such a bias force may be useful in case the actuator force is directed in vertical direction. In such an arrangement, the bias force may be applied to at least partly compensate the weight of the object to be positioned or displaced. In such an arrangement, it may be beneficial to have at least three coil/magnet assemblies, shown in the embodiment of FIG. 7, supporting the object. In that case, the object can efficiently be positioned in Z-direction and rotated around X-direction and Y-direction.

The bias force generated by this particular arrangement of a radial magnetized cylindrical magnet, (in the XY-plane) which at least partly surrounds a cylindrical magnet magnetized in Z-direction, also remains substantially constant in the operating area of the actuator. Therefore, the coil assembly as shown in FIG. 7 results in an actuator embodiment highly suited for positioning objects in vertical direction. It provides an efficient actuator (since the weight of the object can at least partly be compensated for by the passive magnet system) with good vibration isolation properties (both the bias force from the magnetic interaction between magnets 50 and 31 and the actuator force from the interaction between coils 34,35 and the magnet 31 are substantially constant in the operating area). It will be appreciated that the arrangement as shown in FIG. 7 can also be equipped with additional coils, as in FIG. 5, or can be equipped with coils as shown in FIG. 6.

Figure 8A:
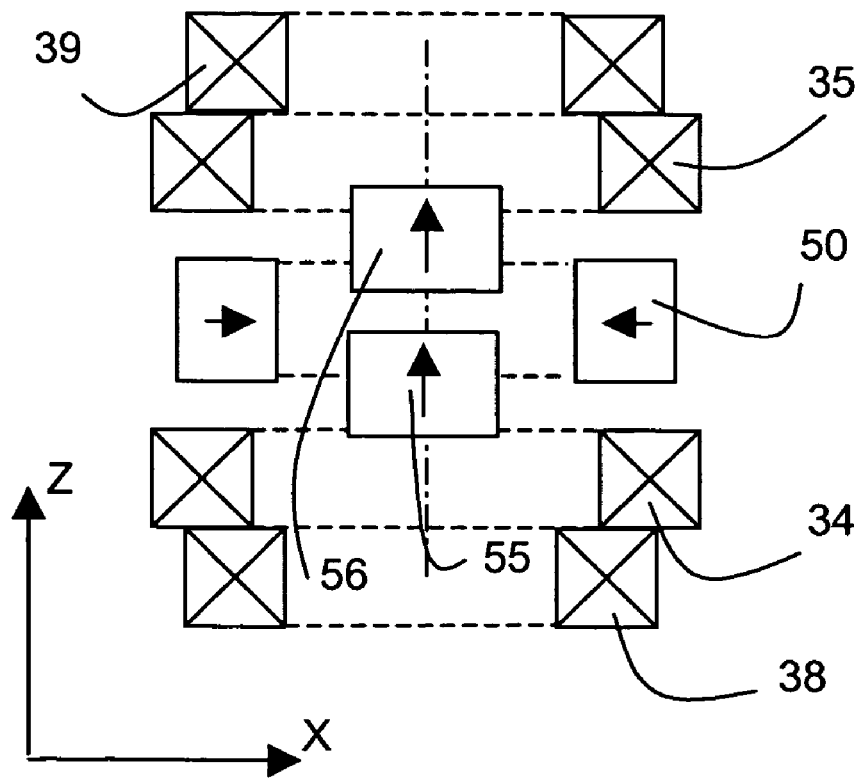
FIG. 8a schematically depicts an electromagnetic actuator according to an embodiment of the present invention.
Figure 8B:
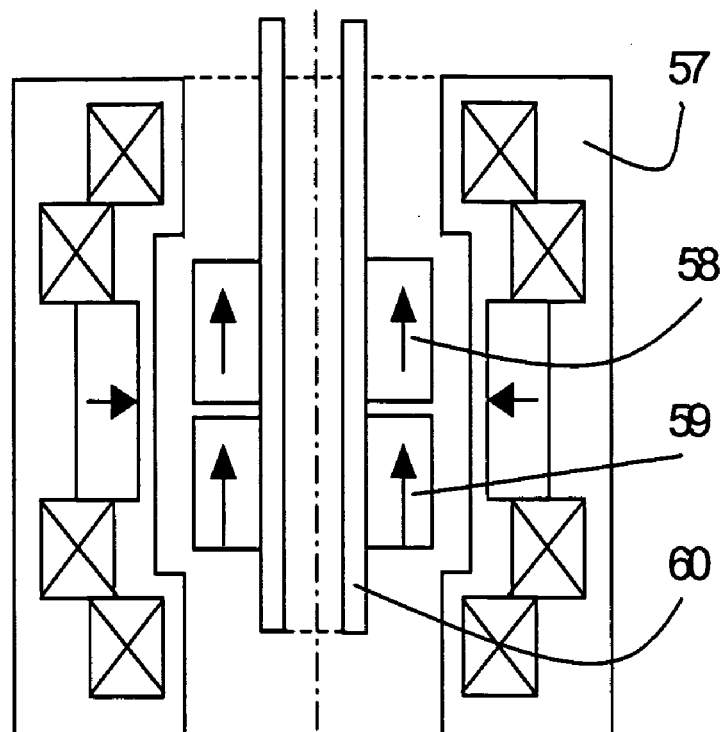
FIG. 8b schematically depicts an electromagnetic actuator according to an embodiment of the present invention including a cooling body.

In order to make the generated bias force adjustable to some extent, the magnet 31 can be subdivided into two magnets. FIG. 8a shows an embodiment of the present invention wherein the magnet assembly of the actuator includes two magnets 55,56 both magnetized in Z-direction. In this embodiment, the generated bias force can be adjusted by adjusting the gap between the magnets 55 and 56 resulting in a more flexible use of the actuator, i.e. for supporting objects of various weights. FIG. 8b shows a similar arrangement as the embodiment of FIG. 8a. In FIG. 8b, a cooling body 57 surrounds the coil assembly. The cooling body is equipped with cooling ducts having a rectangular cross-section. It will be appreciated that the cooling ducts may also have another cross-sectional shape. The cooling body may be made of ceramics such as SiC or, as another example, of non-magnetic stainless steel. The magnet assembly includes two magnets 58, 59 magnetized in vertical direction. The magnets 58, 59 have a hollow cylindrical shape and are mounted on a rod 60 that provides an interface to the object to be displaced. Typical dimensions of the actuator are as follows: the height of the cooling body is about 50 mm, the diameter of the cooling body is about 50 mm, the bias force generated is about 80 N, the mass of magnets 58, 59 and rod 60 is about 150 g, the actuator stiffness over a stroke of about 3 mm in vertical direction is lower than about 150 N/m, the actuator stiffness in radial direction over a stroke of about 1 mm is lower than 200 N/m, and the steepness of the actuator is about 8 $N^2/W$. Simulations show that the temperature rise of the coils can be limited to a few degrees Celsius for a total dissipation of about 10 W in the coils. Due to this small temperature difference between coils and environment, the heat flux to the environment remains small (i.e. lower than about 0.05 W). A small heat flux to the environment surrounding the object will help to maintain the object at a predefined temperature. An efficient cooling of the actuators that are located in the environment surrounding the object will help to enable this goal.

Figure 9:
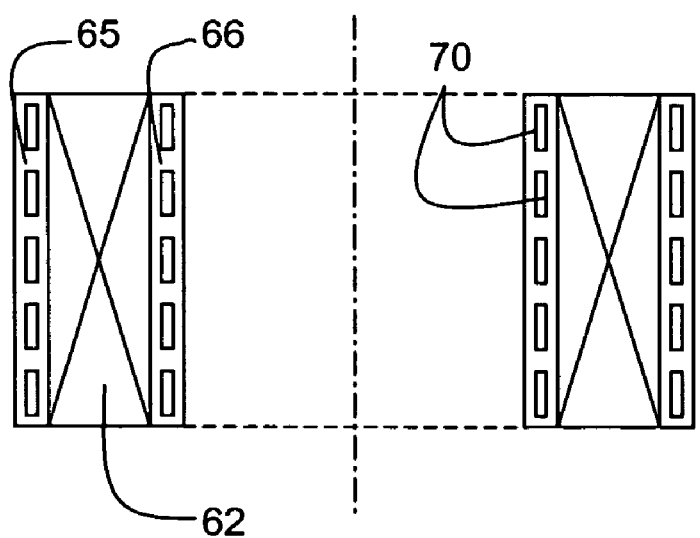
FIG. 9 schematically depicts a coil enclosed by two cooling bodies according to an embodiment of the invention.
Figure 10:
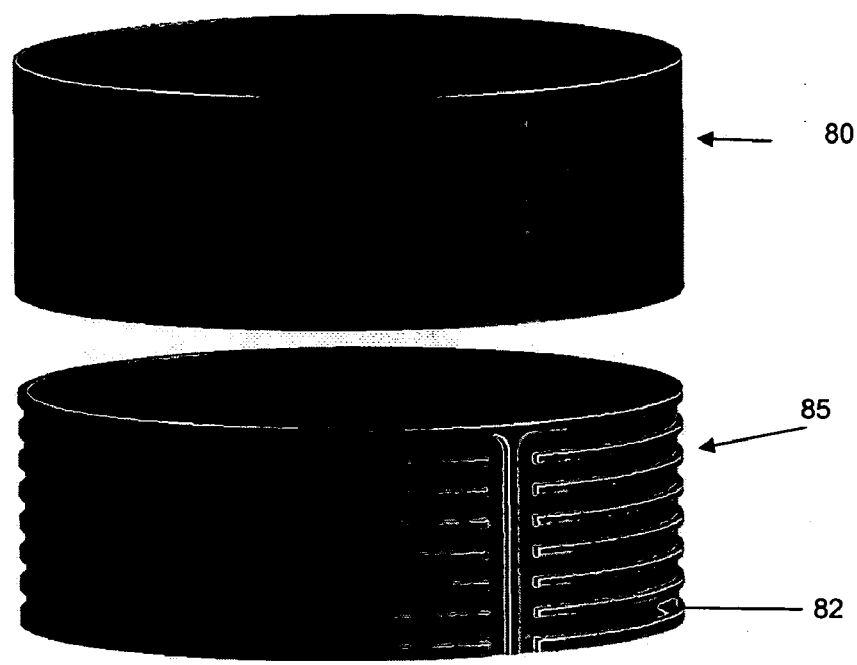
FIG. 10 schematically depicts a cooling body including two parts for cooling a cylindrical coil according to an embodiment of the invention.
Figure 11:
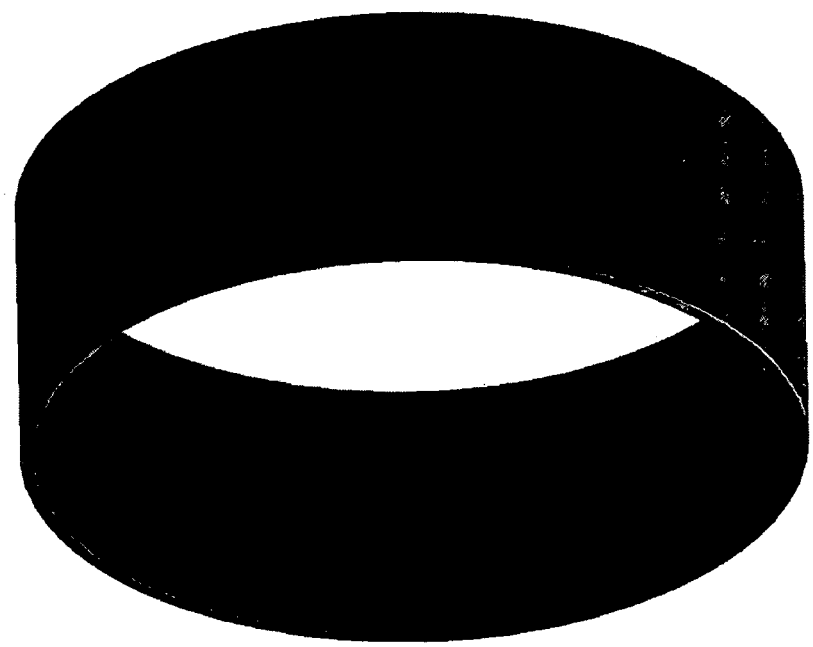
FIG. 11 schematically depicts the cooling body of FIG. 10 in an assembled state.

FIG. 9 shows a cross-section of a cylindrical coil 62 combined with two cooling bodies 65,66 in accordance with an embodiment of the invention. The cross-section of the cooling bodies 65,66 are provided with cooling ducts 70 through which a fluid can flow. FIG. 10 schematically shows an embodiment of such a cooling body. The cooling body includes two cylindrical bodies 80,85 that can be assembled into one cylindrical body. In the embodiment shown in FIG. 10, the inner cylindrical body 80 is equipped with 7 parallel cooling channels 82. FIG. 11 shows the cooling body of FIG. 10 in its assembled state. The cooling body as described in FIGS. 10 and 11 has a single inlet and a single outlet for the cooling fluid. It will be appreciated that a cooling body with multiple inputs and/or outputs may also be possible. It will also be appreciated that a similar cooling body can be arranged around coils having a non-cylindrical shape such as rectangular coils or more conventional coils. It will also be appreciated that the cooling method as described can be combined with other cooling assemblies at the top or bottom surface of the coil.

While specific embodiments of the invention have been described above, it will be appreciated that the invention may be practiced otherwise than as described. The description is not intended to limit the invention.

What is claimed is:

1. A lithographic apparatus comprising:
   (a) an illumination system configured to condition a beam of radiation;
   (b) a support structure configured to support a patterning device, the patterning device serving to impart the beam of radiation with a pattern in its cross-section;
   (c) a substrate table configured to hold a substrate;
   (d) a projection system configured to project the patterned beam of radiation onto a target portion of the substrate, and
   (e) an actuator configured to position a first part of the lithographic apparatus relative to a second part of the apparatus in a first direction, the actuator comprising:
      (i) a first assembly attached to the first part, the first assembly comprising a permanent magnet magnetized in substantially the first direction, and
      (ii) a second assembly attached to the second part, the second assembly comprising at least two non-magnetic coils having conductive parts substantially perpendicular to said first direction,
   wherein said at least two coils are spaced apart in said first direction so as to define a space between them in which said permanent magnet of said first assembly is at least partly located.

2. The lithographic apparatus of claim 1, wherein the second assembly is provided with at least two additional coils having conductive parts substantially perpendicular to said first direction, the at least two additional coils being spaced apart in said first direction so as to define a space between them in which said permanent magnet of said first assembly is at least partly located.

3. The lithographic apparatus of claim 1, wherein an inner width of the at least two coils varies along said first direction.

4. The lithographic apparatus of claim 2, wherein an inner width of the at least two coils and the at least two additional coils varies along said first direction.

5. The lithographic apparatus of claim 1, wherein the second assembly further comprises a cylindrical permanent magnet magnetized in a radial direction substantially perpendicular to the first direction, said cylindrical permanent magnet at least partly enclosing said first assembly.

6. The lithographic apparatus of claim 1, wherein the first assembly further comprises at least another permanent magnet magnetized substantially in said first direction, said permanent magnet and said at least another permanent magnet being moveable relative to each other in said first direction so as to define an adjustable gap between them.

7. The lithographic apparatus of claim 1, wherein the actuator is configured to position the substrate, the patterning device, or an optical element.

8. The lithographic apparatus of claim 1, wherein the first part is a base part or a long stroke module and the second part is a short stroke module, the substrate table, the patterning device support structure, an isolated reference frame, a metrology frame, or an optical element support structure.

9. The lithographic apparatus of claim 1, wherein said at least two coils are mounted on a cooling assembly configured to remove heat dissipated by said coils.

10. The lithographic apparatus of claim 9, wherein said cooling assembly includes a plurality of cooling ducts through which a fluid flows.

11. The lithographic apparatus of claim 9, wherein said cooling body includes a non-magnetic material.

12. The lithographic apparatus of claim 2, wherein said two additional coils have an inner diameter lower than said at least two coils.

13. The lithographic apparatus of claim 2, wherein said two additional coils are located at a greater distance from said permanent magnet than the at least two coils.

14. A device manufacturing method comprising:
patterning a beam of radiation;
projecting the patterned beam of radiation onto a target portion of a substrate, and
positioning a first part of a machine relative to a second part of the machine in a first direction by an actuator that comprises:
 a first assembly attached to the first part, the first assembly comprising a permanent magnet that is magnetized substantially in the first direction, and
 a second assembly attached to the second part, the second assembly comprising at least two non-magnetic coils having conductive parts substantially perpendicular to said first direction,
wherein said at least two coils are spaced apart in said first direction so as to define a space between them in which said permanent magnet of said first assembly is at least partly located.

15. The method of claim 14, wherein the actuator is configured to position the substrate, the patterning device, or an optical element.

16. The method of claim 14, wherein the first part is a base part or a long stroke module and the second part is a short stroke module, the substrate table, the patterning device support structure, an isolated reference frame, a metrology frame, or an optical element support structure.

17. An actuator configured to position a first part of a lithographic apparatus relative to a second part of the apparatus in a first direction, the actuator comprising:
a first assembly attached to the first part, the first assembly comprising a permanent magnet having a direction of magnetization substantially parallel to said first direction, and
a second assembly attached to the second part, the second assembly comprising at least two non-magnetic coils having conductive parts substantially perpendicular to said first direction,
wherein said at least two coils are spaced apart in substantially said first direction so as to define a space between them in which said permanent magnet of said first assembly is at least partly located.

18. The actuator of claim 17, wherein said at least two coils and said permanent magnet are at least substantially rotationally symmetric around a common axis substantially parallel to the first direction.

19. The actuator of claim 17, wherein the actuator is configured to position a substrate, a patterning device, or an optical element.

20. A lithographic apparatus comprising:
(a) an illumination system configured to condition a beam of radiation;
(b) a support structure configured to support a patterning device, the patterning device serving to impart the beam of radiation with a pattern in its cross-section;
(c) a substrate table configured to hold a substrate;
(d) a projection system configured to project the patterned beam of radiation onto a target portion of the substrate, and
(e) an actuator configured to position a first part of the lithographic apparatus relative to a second part of the apparatus in a first direction, the actuator comprising:
 (i) a first assembly attached to the first part, the first assembly comprising a permanent magnet magnetized in substantially the first direction, and
 (ii) a second assembly attached to the second part, the second assembly comprising at least two coils having conductive parts substantially perpendicular to said first direction,
wherein said at least two coils are spaced apart in said first direction so as to define a space between them in which said permanent magnet of said first assembly is at least partly located, and
wherein a force generated between the permanent magnet and the at least two coils is substantially independent of a position of the permanent magnet relative to the at least two coils in a range of operation of the actuator.

21. The lithographic apparatus of claim 1, wherein one of the at least two coils is energized with a first current and the other one of the at least two coils is energized with a second current, the first and the second current having opposite directions.

* * * * *